United States Patent
Zhang et al.

(10) Patent No.: US 12,120,887 B2
(45) Date of Patent: Oct. 15, 2024

(54) INCREASING SELECTOR SURFACE AREA IN CROSSBAR ARRAY CIRCUITS

(71) Applicant: TetraMem Inc., Fremont, CA (US)

(72) Inventors: Minxian Zhang, Amherst, MA (US); Ning Ge, Danville, CA (US)

(73) Assignee: TetraMem Inc., Fremont, CA (US)

( * ) Notice: Subject to any disclaimer, the term of this patent is extended or adjusted under 35 U.S.C. 154(b) by 0 days.

(21) Appl. No.: 18/055,951

(22) Filed: Nov. 16, 2022

(65) Prior Publication Data
US 2023/0070508 A1 Mar. 9, 2023

Related U.S. Application Data

(62) Division of application No. 16/522,542, filed on Jul. 25, 2019, now Pat. No. 11,532,668.

(51) Int. Cl.
*H10B 63/00* (2023.01)
*H10N 70/00* (2023.01)

(52) U.S. Cl.
CPC ........... *H10B 63/00* (2023.02); *H10N 70/821* (2023.02); *H10N 70/841* (2023.02)

(58) Field of Classification Search
CPC ..... H10B 63/00; H10N 70/821; H10N 70/841
See application file for complete search history.

(56) References Cited

U.S. PATENT DOCUMENTS

| | | | |
|---|---|---|---|
| 9,905,757 B2 * | 2/2018 | Choi | H10N 70/881 |
| 10,115,800 B1 * | 10/2018 | Kim | H01L 21/0228 |
| 11,532,668 B2 | 12/2022 | Zhang et al. | |
| 2011/0001110 A1 | 1/2011 | Takahashi | |
| 2017/0236869 A1 * | 8/2017 | Tran | H10B 63/30 257/4 |
| 2017/0338279 A1 | 11/2017 | Yang et al. | |
| 2019/0245543 A1 | 8/2019 | Lee et al. | |
| 2019/0296234 A1 | 9/2019 | Yoshimura et al. | |
| 2020/0212105 A1 * | 7/2020 | Majhi | H10N 50/01 |
| 2021/0028229 A1 | 1/2021 | Zhang et al. | |

* cited by examiner

*Primary Examiner* — Benjamin Tzu-Hung Liu
(74) *Attorney, Agent, or Firm* — Jaffery Watson Hamilton & DeSanctis LLP (57) ABSTRACT

The present application provides an apparatus, including: a substrate; a first line electrode formed on the substrate; an interlayer formed on the first line electrode, a selector stack formed on the interlayer and the first line electrode; an RRAM stack formed on the selector stack; and a second line electrode formed on the RRAM stack. The interlayer comprises an upper surface and a sidewall. In some embodiments, a shape of the interlayer comprises a cylinder, a pyramid, a prism, a cone, a pillar, or a protrusion.

11 Claims, 13 Drawing Sheets

INCREASING SELECTOR SURFACE AREA IN CROSSBAR ARRAY CIRCUITS

CROSS-REFERENCE TO RELATED APPLICATION

This application is a divisional of U.S. patent application Ser. No. 16/522,542, filed on Jul. 25, 2019, issued as U.S. Pat. No. 11,532,668, which is hereby incorporated by reference in its entirety.

TECHNICAL FIELD

The present disclosure generally related to crossbar array circuits with selectors and more specifically to increasing the surface area of selectors in crossbar array circuits.

BACKGROUND

Traditionally, a crossbar array circuit may include horizontal metal wire rows and vertical metal wire columns (or other electrodes) intersecting with each other in a two-dimension (2D) plane, with crossbar devices formed at the intersecting points. The crossbar array may be used in non-volatile solid-state memory, signal processing, control systems, high-speed image processing, neural network, machine learning, and other applications.

A Resistive Random-Access Memory (RRAM) is a two-terminal passive device that is capable of changing resistance upon sufficient electrical stimulations, which have attracted significant attention for high-performance nonvolatile memory applications. The resistance of the RRAM may be electrically switched between two states: high-resistance state (HRS) and a low-resistance state (LRS). The switching event from HRS to LRS is called "Set" or "On" switching process. Conversely, the switching from LRS to HRS is called "Reset" or "Off" switching process.

A selector is a two-terminal device capable of delivering voltage to a selected RRAM device. In conventional 2D crossbar array circuits having a one-selector-one-memristor (1S1R) architecture, a RRAM and a selector may be serially connected to reduce sneak path current, to improve the read and write operation, and to reduce array's power consumption.

SUMMARY

Technologies relating to increasing the surface area of selectors in crossbar array circuits are provided.

An apparatus, in some implementations, includes: a substrate; a first line electrode formed on the substrate; an RRAM stack formed on the first line electrode, wherein the RRAM stack; an isolation layer formed beside the RRAM stack, wherein the isolation layer includes an upper surface and a sidewall, and a height from the upper surface to the first line electrode is 100 nanometers to 10 micrometers; a selector stack formed on the RRAM stack, the sidewall, and the upper surface; and a second line electrode formed on the selector stack.

In some implementations, a material of the substrate includes Si, $SiO_2$, SiN, $Al_2O_3$, AlN, gallium arsenide, or glass.

In some implementations, a material of the first line electrode includes Pt, Ti, TiN, Pd, Ir, W, Ta, Hf, Nb, V, TaN, NbN, a combination thereof, or an alloy of one or more conductive materials and Pt, Ti, TiN, Pd, Ir, W, Ta, Hf, Nb, V, TaN, NbN, or a combination thereof.

In some implementations, the RRAM stack includes a first bottom electrode, an RRAM oxide layer, and a first top electrode.

In some implementations, a material of the RRAM oxide layer includes $TaO_x$, $HfO_x$, $TiO_x$, ZrOx, or a combination thereof.

In some implementations, a material of the first bottom layer includes Pt, Pd, Ir, Ti, a combination thereof, or an alloy of one or more conductive materials and Pt, Pd, Ir, Ti, or a combination thereof.

The selector stack, in some implementations, includes a second bottom electrode, a first outer layer, an inner layer, a second outer layer, and a second top electrode.

In some implementations, a material of the second bottom layer includes Pt, Pd, Ir, Ti, a combination thereof, or an alloy of one or more conductive materials and Pt, Pd, Ir, Ti, or a combination thereof.

In some implementations, the first outer layer includes $TaN_{1+x}$, and the inner layer includes $Ta_2O_5$.

An apparatus, in some implementations, includes: a substrate; a first line electrode formed on the substrate; an interlayer formed on the first line electrode, wherein the interlayer includes an upper surface, and a sidewall, and a shape if the interlayer includes a cylinder, a pyramid, a prism, a cone, a pillar, or a protrusion; a selector stack formed on the interlayer, and the first line electrode; an RRAM stack formed on the selector stack; and a second line electrode formed on the RRAM stack.

In some implementations, the height (or thickness) between the upper surface and the first line electrode is 100 nanometers to 10 micrometers.

The selector stack, in some implementations, is of a reverse U-shape in a cross-sectional view.

The selector stack, in some implementations, includes a first bottom electrode, a first outer layer, an inner layer, a second outer layer, and a first top electrode, and the RRAM stack includes a second bottom electrode, an RRAM oxide layer, and a second top electrode.

In some implementations, a material of the first outer layer includes $TaN_{1+x}$, a material of the inner layer includes $Ta_2O_5$, and a material of the RRAM oxide layer includes $TaO_x$, $HfO_x$, $TiO_x$, $ZrO_x$, or the combinations thereof.

BRIEF DESCRIPTION OF THE DRAWINGS

The implementations disclosed herein are illustrated by way of example, and not by way of limitation, in the figures of the accompanying drawings. Like reference numerals refer to corresponding parts throughout the drawings.

DETAILED DESCRIPTION

Technologies relating to increasing the surface area of selectors in crossbar array circuits are provided. These technologies may provide the following technical advantages.

First, the high non-linearity selectors described in the present disclosure suppress sneak path current, providing efficient leakage control in 1S1R crossbar array circuits.

Second, increasing the surface area of a selector can provide sufficient operation current in 1S1R crossbar array circuits, without increasing either operation voltage or the size of a 1S1R device.

Third, the example manufacturing methods described in the present disclosure provide better surface conformity and uniformity and thus reduce defects or leakage paths within a selector, especially in stiff, high aspect ratio structures of a selector.

Fourth, the present disclosure provides various designs of a 1S1R structure (e.g., 1S on top of 1R and 1R on top of 1S) to accommodate different circuit design needs.

Figure 1:
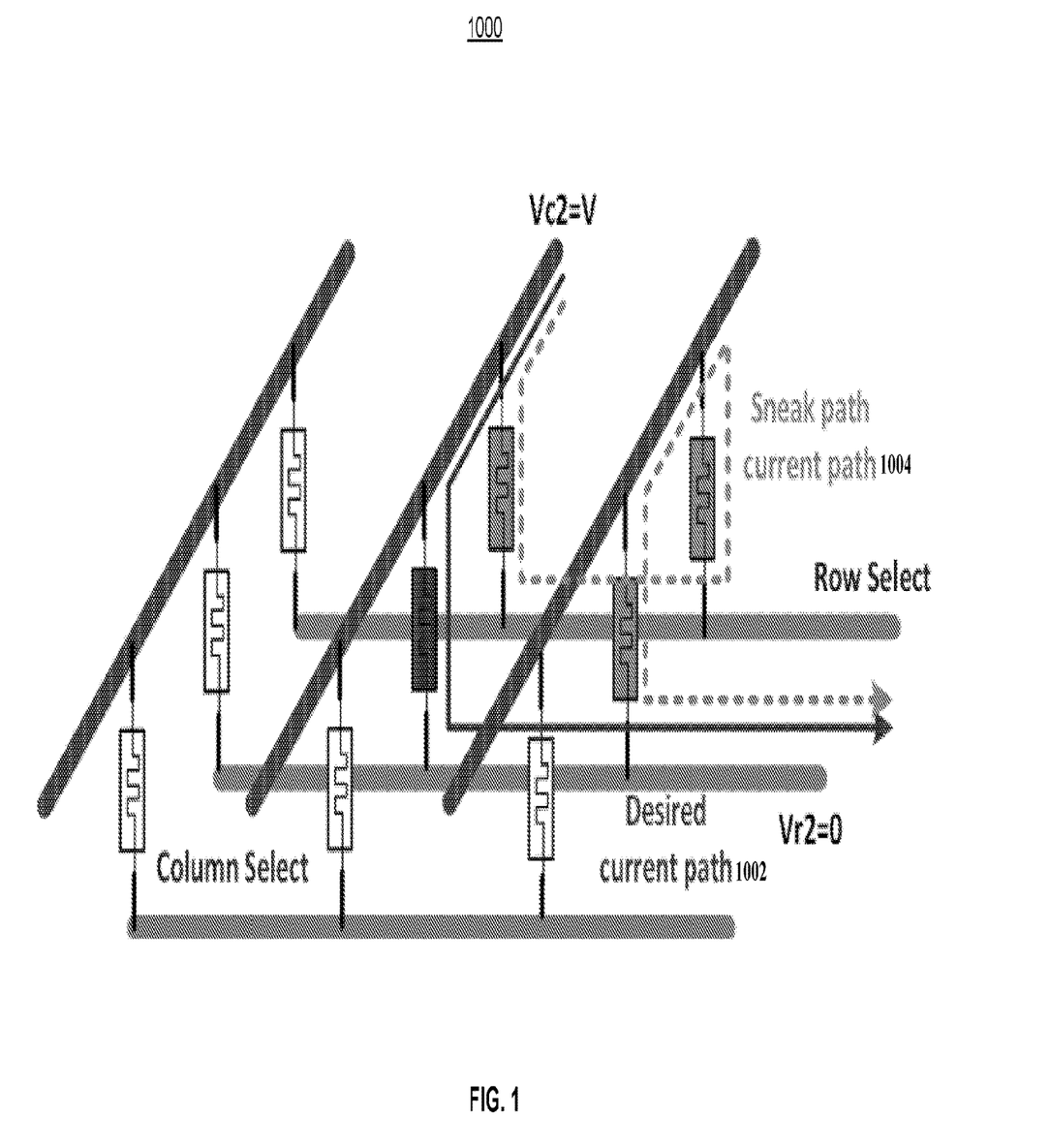
FIG. 1 is a block diagram illustrating an example RRAM crossbar array circuit.

FIG. 1 is a block diagram illustrating an example RRAM crossbar array circuit 1000.

The RRAM crossbar array circuit 1000 shows an example structure of a high-density memory cell circuit. The RRAM crossbar array circuit 1000 may be configured to perform Vector-Matrix Multiplication (VMM) or other large-scale multiplications-accumulations in a neural network, machine learning, or other in-memory computing applications.

Sneak path current, however, may occur in the RRAM crossbar array circuit 1000. The current path 1002, as shown in FIG. 1, identifies a desired current path within the RRAM crossbar array circuit 1000. An undesired current path (also sometimes referred to as a sneak current path) 1004 may exist in the RRAM crossbar array circuit 1000. A sneak current path not only reduces power efficiency, but also generates unwanted errors during computations. These technical difficulties are exacerbated in a large-scale crossbar array circuit (e.g., a 128×128 crossbar array circuit), because a great number of sneak path currents may exist.

Figure 2:
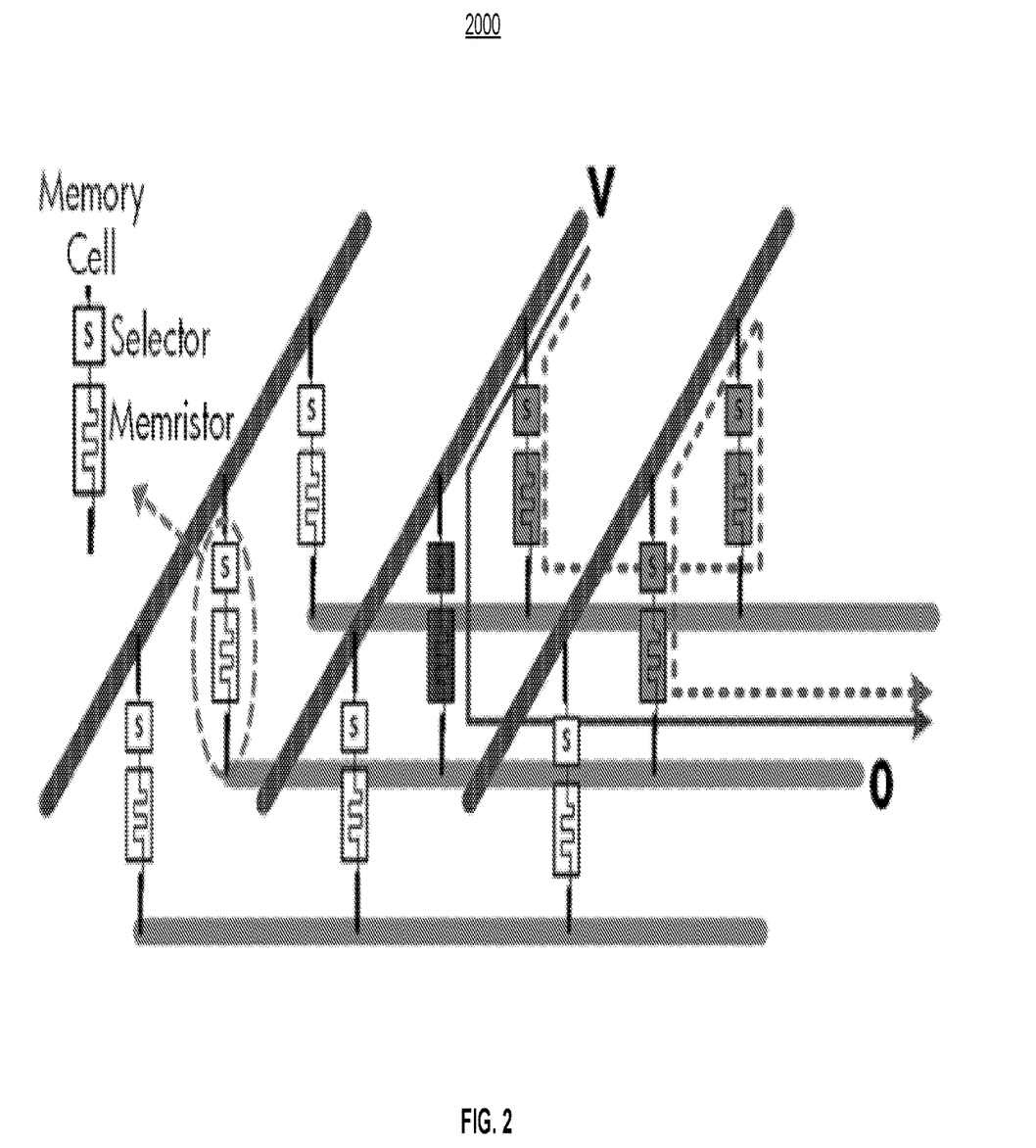
FIG. 2 is a block diagram illustrating an example 1S1R crossbar array circuit.

FIG. 2 is a block diagram illustrating an example 1S1R crossbar array circuit 2000.

The 1S1R crossbar array circuit 2000 shown in FIG. 2 provides an example solution to technical problem of reducing or eliminating sneak path currents. One or more selectors may be used to reduce or eliminate sneak path currents in a crossbar array and regulate the intended currents to flow through only one or more desired paths. A selector often has high non-linear I-V characteristics and is thus volatile. A two-terminal device, a selector may be serially connected to a memristor to form a 1S1R structure and may achieve 4F2 density (4 F square with F being the critical dimension of a technology node). A selector, when in the OFF state, provides high resistance, preventing sneak path current from passing through an unselected RRAM.

Figure 3A:
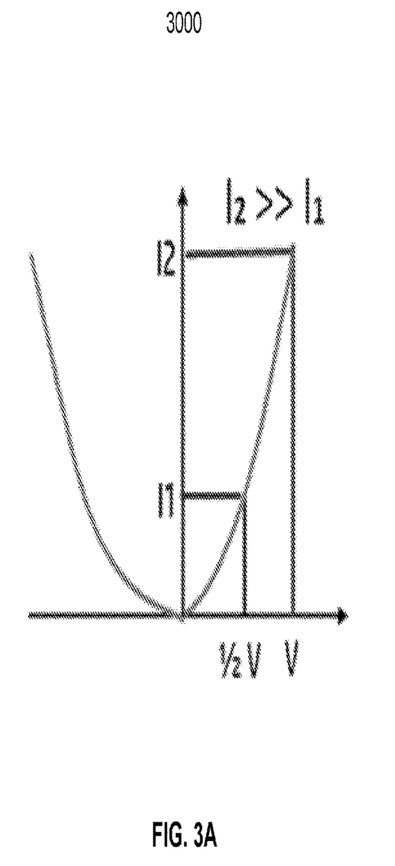
FIG. 3A is an I-V curve illustrating example non-linear characteristics of a selector.
Figure 3B:
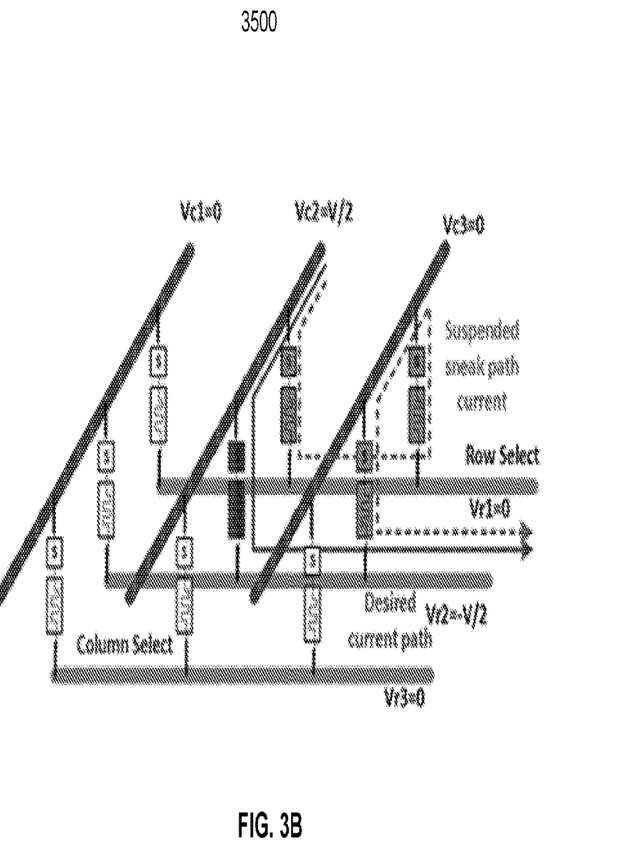
FIG. 3B is a block diagram illustrating an example crossbar array circuit having the non-linear characteristics shown in FIG. 3A.

FIG. 3A is an I-V curve illustrating example non-linear characteristics 3000 of a selector. FIG. 3B is a block diagram illustrating an example crossbar array circuit 3500 having the non-linear characteristics shown in FIG. 3A.

As shown in FIG. 3A, a selector's high non-linearity can be defined by the current ratios at full operation voltage ($V_{op}$) and at half operation voltage (½ $V_{op}$) (I2 and I1 respectively). The larger the ratio is, the higher the non-linearity is.

To select a device in a crossbar array, a first voltage +V/2 and a second voltage −V/2 are applied to the row line and column line, the cross point of which identifies the selected device. As a result of these voltage applications, the selected device is biased at full voltage V and allows high current flow. Half-selected devices on the selected row and column have half voltage +V/2 or −V/2 and allow low current flow. Unselected devices in the crossbar array have no voltage and thus no current flow. In these ways, selectors may be used to reduce or eliminate sneak path currents in a crossbar array.

Technical challenges may arise, however, in the implementations where selectors do not provide high linearity. To address these technical challenges, in some implementations, one or more tunneling based selectors may be used to reduce or eliminate sneak current.

Figure 4A:
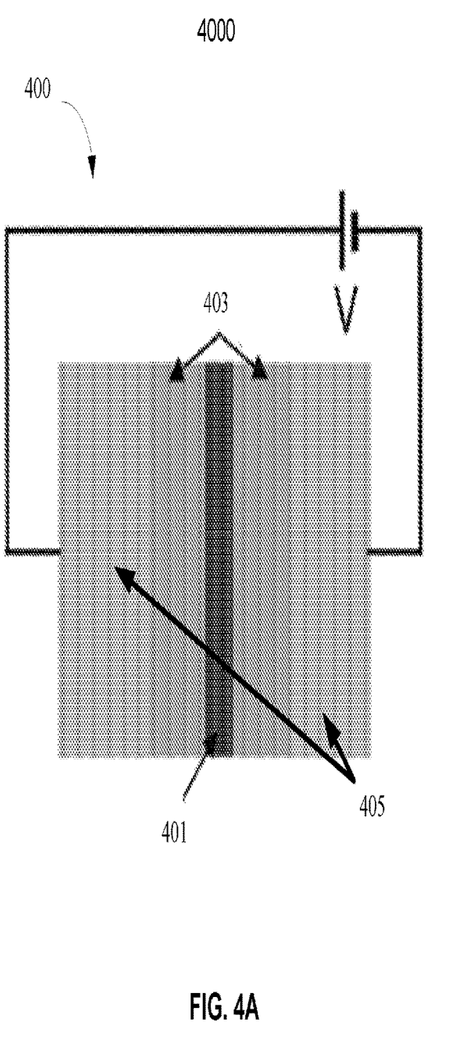
FIG. 4A is a block diagram illustrating an example tunneling based selector.

FIG. 4A is a block diagram 4000 illustrating an example tunneling based selector 400.

The tunneling based selector 400 includes a three-layer crested barrier structure, which includes a center layer 401, two outer layers 403 formed on sides of the center layer 401, and two electrodes 405 formed on sides of the two outer layers 403.

Figure 4B:
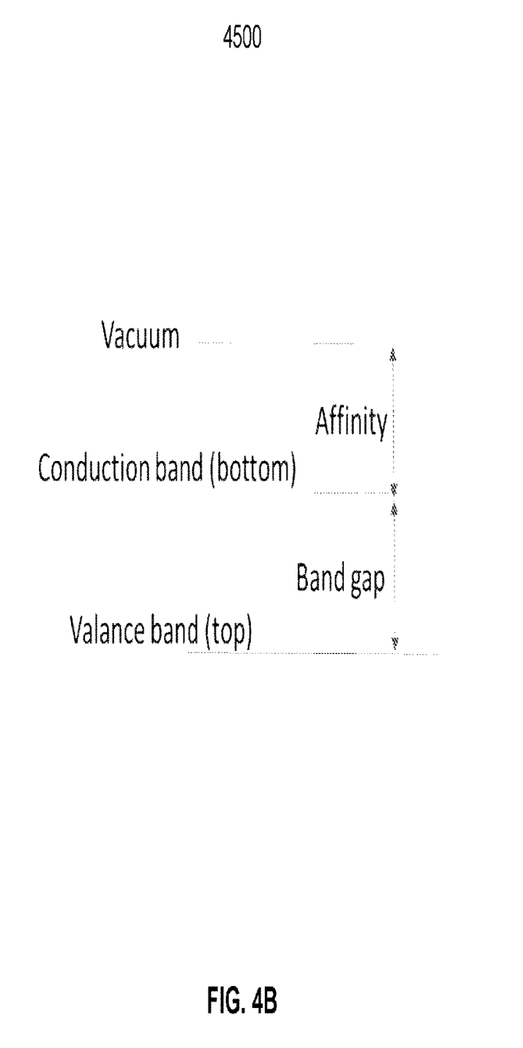
FIG. 4B is a bandgap chart illustrating example bandgap and electron affinity of the tunneling based selector shown in FIG. 4A.

FIG. 4B shows a bandgap chart 4500 illustrating the bandgap and electron affinity of the tunneling based selector 400 shown in FIG. 4A.

The center layer 401 includes a dielectric material with a larger bandgap and smaller electron affinity than the outer layers 403. For instance, the center layer 401 may include:
$Ta_2O_5$: bandgap≈4.1 eV, electron affinity≈3.2 eV The outer layer 403 includes a dielectric layer with a smaller bandgap and larger electron affinity than the center layer 401. For instance, the outer layer 403 may include:
$TaN_{1+x}$: bandgap≈2 eV, electron affinity≈4 eV
$TaN_{1+x}$, x>0, is N-rich tantalum nitride material and is dielectric, x≈1.6 for $Ta_3N_5$.

Therefore, one example of tunneling based selector 400 includes a $TaN_{1+x}$ (3 nm)/$Ta_2O_5$ (2.5 nm)/$TaN_{1+x}$ (3 nm) tri-layer stack.

Figure 5:
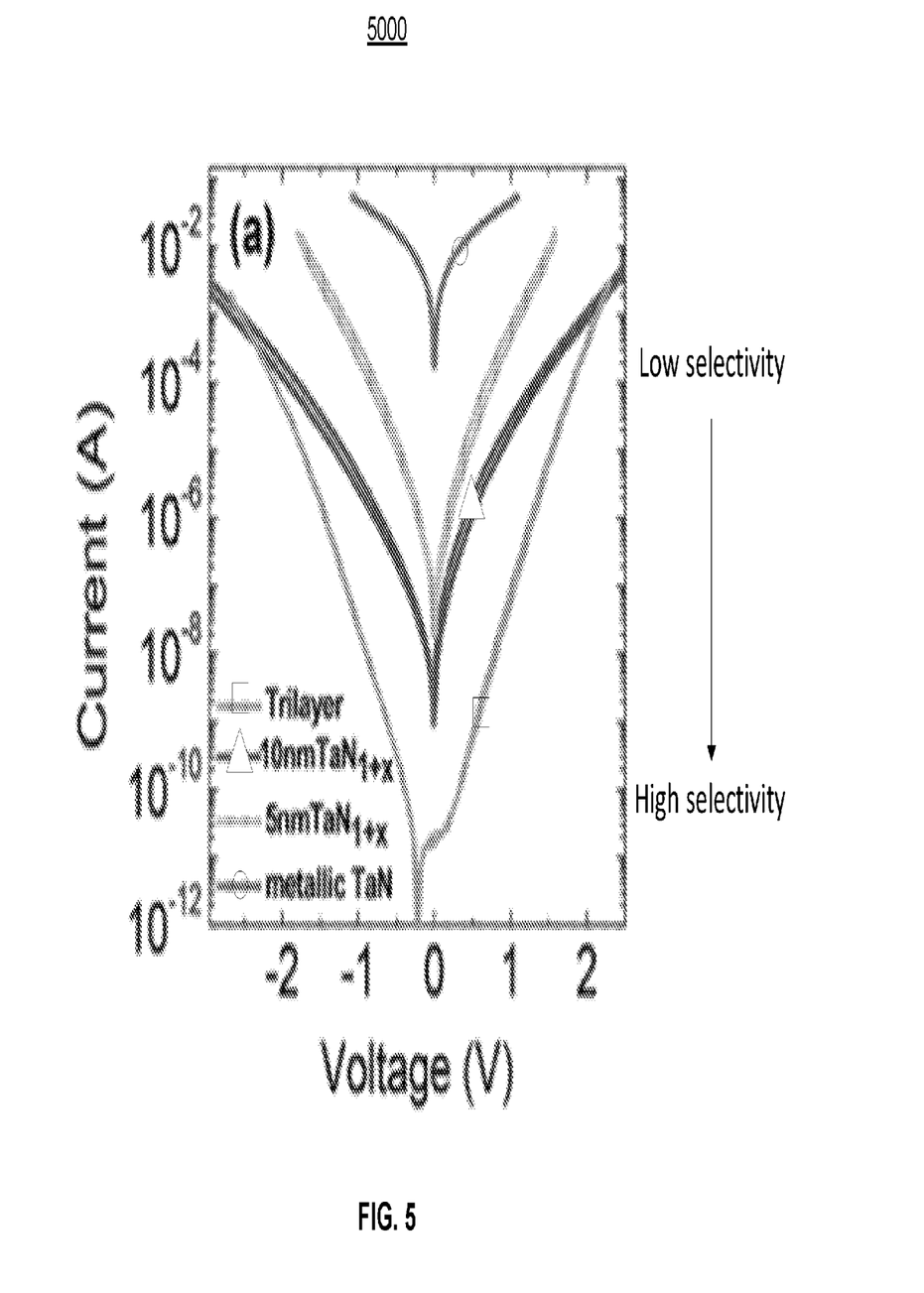
FIG. 5 is an IV curve comparing the selectivity of a tri-layer stack with those of other selector stacks.

FIG. 5 are IV curves comparing the selectivity of a tri-layer stack with those of other selector stacks. As FIG. 5 shows, the tri-layer (the tunneling based selector 400) may provide a higher selectivity than do other selector stacks.

Non-linearity k may be defined as the current ratio at full voltage $V_{op}$ and half voltage $V_{op}$ ($V_{op}/2$). In the tunneling based selector 400, k may be equal to 11,000 (270 nA at 1V, 3 mA at 2V).

However, tunneling based selectors with high non-linearity may also provide with low current density. In 1S1R configurations, a tunneling based selector 4000 may not function as well in operations to provide sufficient current to program a RRAM. For example, the current of 1S may need to be increased for set or reset 1R operation.

Operation currents may be increase in several ways.

First, increasing the operation voltage $V_{op}$ may result in increased operation currents. The $V_{op}$, however, is limited by the total voltage available from drive circuit for the whole 1S1R operations. Further, a higher $V_{op}$ increases the likelihood of a tunneling based selector suffers a dielectric damage or breakdown. As such, increasing the operation voltage $V_{op}$ is not without limitation and can bring about negative consequences.

Second, increasing the size of a selector may result in increased operation currents. This approach also has its shortcomings. In 1S1R confutations, increasing the size of a selector size may increase the F (the minimum feature size), which reduces the density of a crossbar device—an undesirable result.

As such, both increasing the operation voltage and increasing the size of a selector may not produce the desired outcome in a 1S1R crossbar array circuit.

The present disclosure provides a new technical solution for increasing operation currents—increasing the surface area of a selector, which increases operation currents in a selector without requiring increased operation voltage or increased 1S1R device size. Further, because increasing the surface area of a selector does not necessarily increase the footprint of the selector, selector size and device density are often not affected. In some implementations, increasing the surface area of a selector includes building a tunneling based selector 4000 as a 3D structure or in the vertical direction (in addition to the horizontal directions).

Next, various designs for a 1S1R structure are provided, in each of which the surface area of a selector is increased to increase operation currents.

The 1S on Top of 1R Architecture

FIGS. 6A-6F are block diagrams illustrating an example 1S on top of 1R architecture in accordance with the present disclosure. FIG. 7 is a flow chart illustrating an example method 7000 for manufacturing a cross bar array circuit having a 1S on top of 1R architecture in accordance with some implementations of the present disclosure.

Figure 6A:
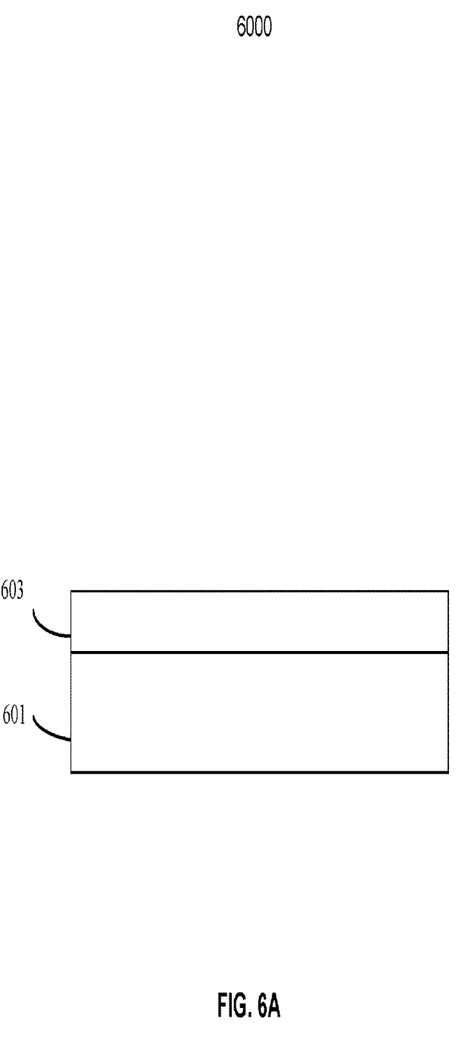
FIGS. 6A-6F are block diagrams illustrating an example 1S on top of 1R architecture in accordance with the present disclosure.
Figure 7:
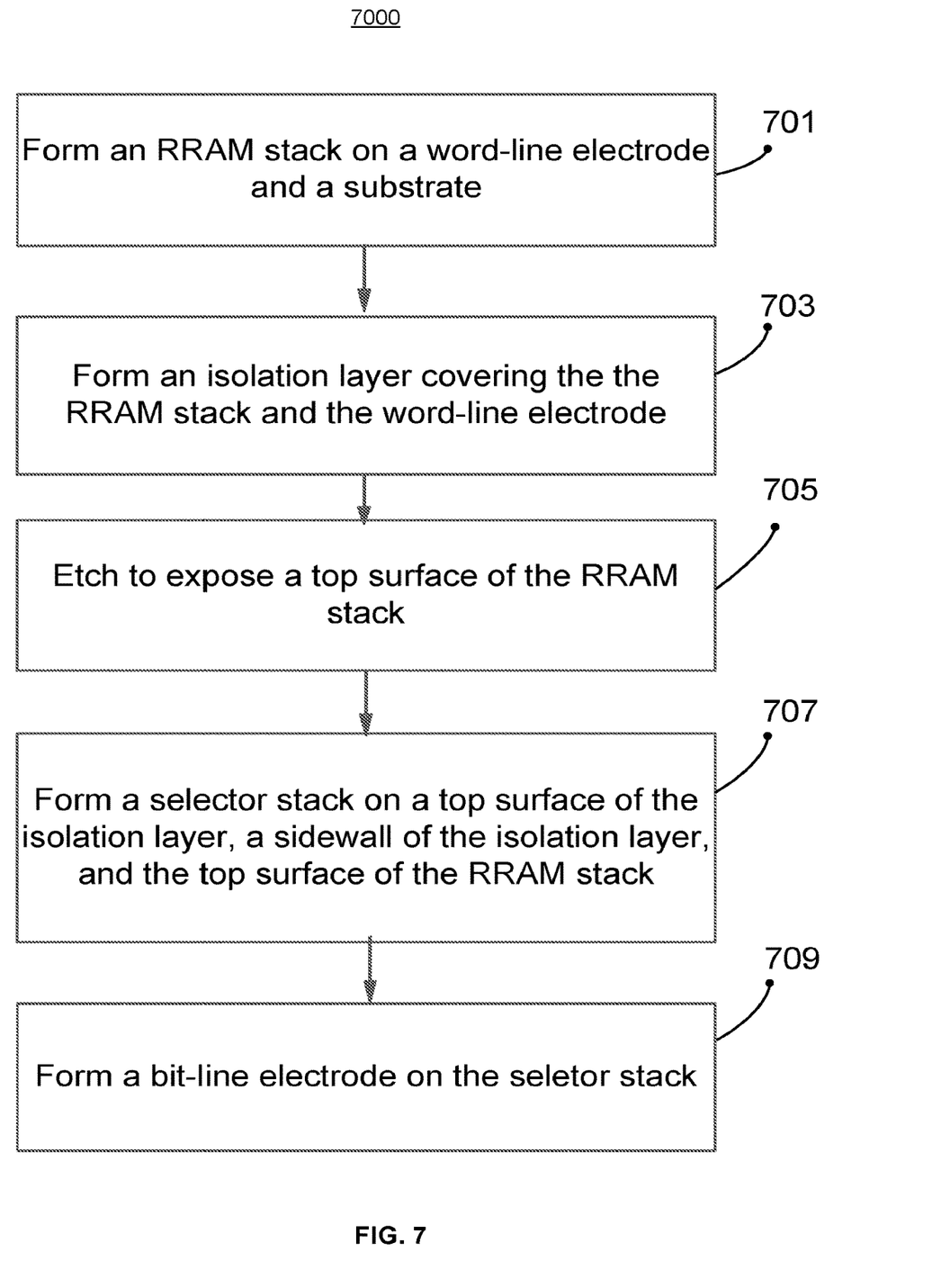
FIG. 7 is a flow chart illustrating an example method for manufacturing a cross bar array circuit having a 1S on top of 1R architecture in accordance with some implementations of the present disclosure.

As shown in FIG. 6A, a substrate 601 is provided, and a first line electrode 603 (e.g., a word-line electrode 603) is formed on the substrate 601.

In some implementations, the substrate 601 includes Si, $SiO_2$, SiN, $Al_2O_3$, AlN, gallium arsenide, glass, or a combination thereof. In some implementations, the substrate 601 includes one or more doped regions, for example, one or more p-doped regions and one or more n-doped regions. In some implementations, the substrate 601 may include transistors, integrated circuits, and interconnects. The substrate 601 may be a workpiece that supports various layers formed on and over and attached to the substrate 601.

In some implementations, the first line electrode 603 includes Pt, Ti, TiN, Pd, Ir, W, Ta, Hf, Nb, V, TaN, NbN, a combination thereof, or an alloy of one or more conductive materials Pt, Ti, TiN, Pd, Ir, W, Ta, Hf, Nb, V, TaN, NbN, or a combination thereof.

In some implementations, the word-line electrode 603 is configured to write to a RRAM stack along a row wire.

Figure 6B:
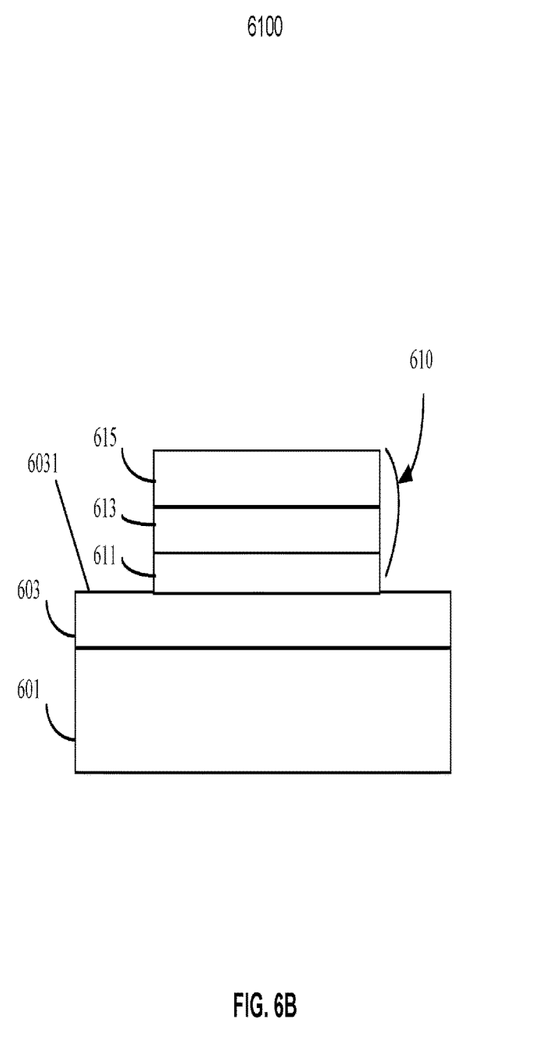

Next, as shown in FIG. 6B, an RRAM stack 610 is formed on the first line electrode 603 and the substrate 601 (step 701).

The RRAM stack 610 includes a first bottom electrode 611, an RRAM oxide layer 613 formed on the first bottom electrode 611, and a first top electrode 615 formed on the RRAM oxide layer 613.

In some implementations, an etching process is applied to expose a top surface of the first line electrode 6031. The etching process may be a wet etching process or a dry etching process.

The RRAM oxide layer 613, in some implementations, includes $TaO_x$, $HfO_x$, $TiO_x$, $ZrO_x$, or a combination thereof. The first bottom electrode 611, in some implementations, includes Pt, Pd, Ir, Ti, a combination thereof, or an alloy of one or more conductive materials and Pt, Pd, Ir, Ti, or a combination thereof.

The first top electrode 615, in some implementations, includes Pt, Ti, TiN, Pd, Ir, W, Ta, Hf, Nb, V, TaN, NbN, a combination thereof, or an alloy of one or more conductive materials Pt, Ti, TiN, Pd, Ir, W, Ta, Hf, Nb, V, TaN, NbN, or a combination thereof.

Figure 6C:
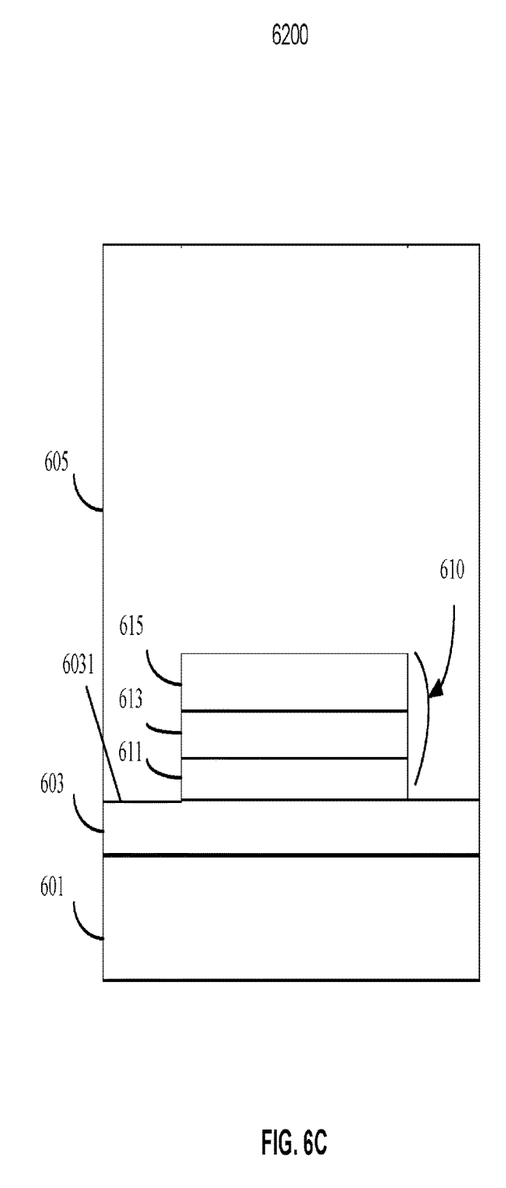

Next, as shown in FIG. 6C, an isolation layer 605 is formed on the top surface of the first line electrode 6031, and the RRAM stack 610 (step 703). In some implementations, after forming the isolation layer 605, a planarization process may be performed using chemical or mechanical polishing techniques.

Figure 6D:
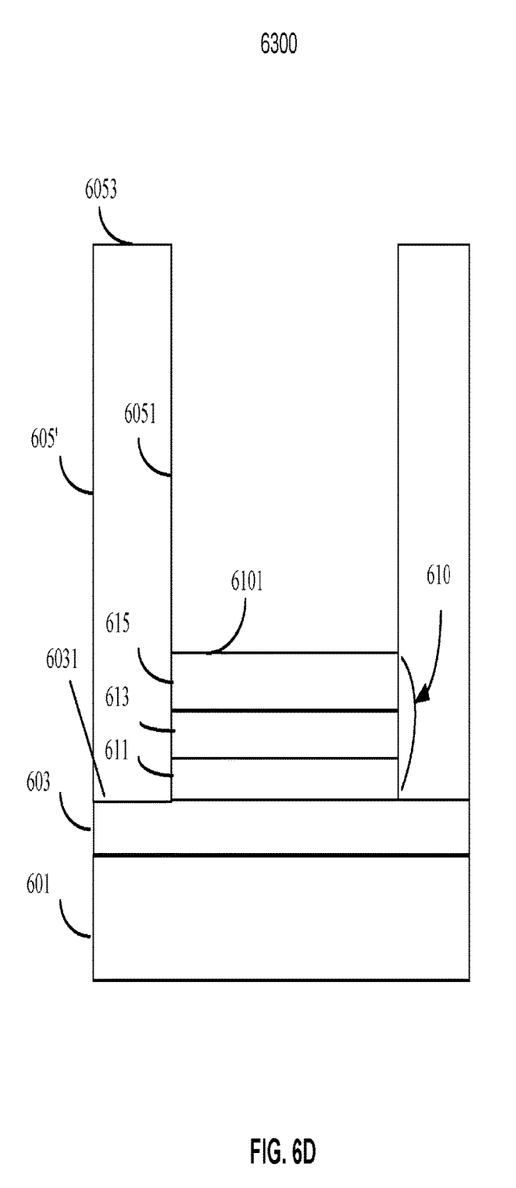

Next, as shown in FIG. 6D, the isolation layer 605 is etched to expose a top surface of the RRAM stack 6101 (step 705).

The etched isolation layer 605' includes an upper surface 6053 and a sidewall 6051. The etched isolation layer 605' is formed on the outer side of the RRAM stack 601.

In some implementations, the height (or the thickness) between the upper surface 6053 and the top surface of the first line electrode 6031 may be 100 nanometers to 10 micrometers (e.g., 500 nanometers). The thickness of the isolation layer enables a selector to form not only on top of the RRAM stack but also on the vertical side walls of the isolation layer 6051 and to increase the selector surface area as explained above. The isolation layer 603, in some implementations, includes $SiO_2$, SiN, or a combination thereof.

Figure 6E:
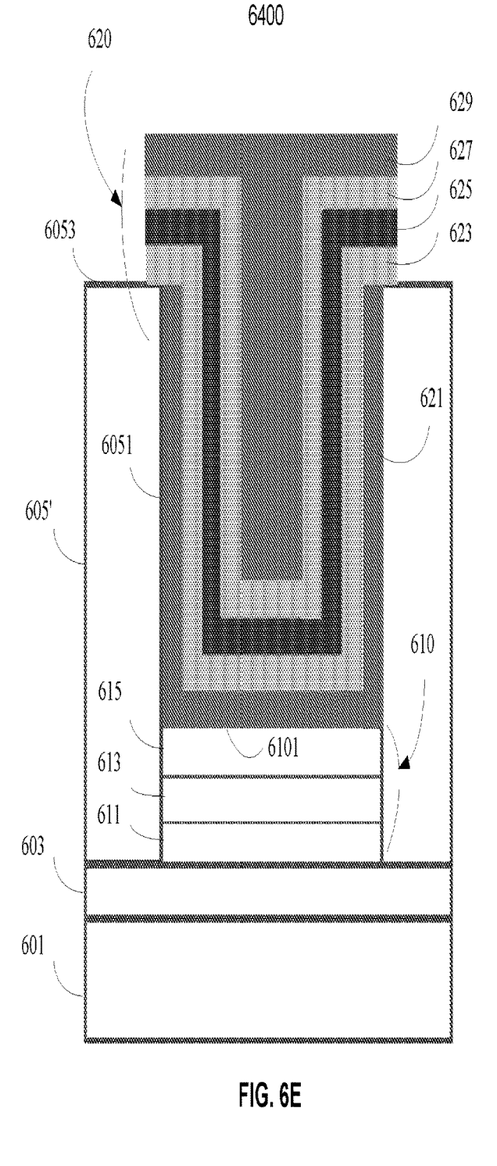

Next, as shown in FIG. 6E, a selector stack 620 may be formed on the top surface of the RRAM stack 6101, the sidewall of the isolation layer 6051, and the upper surface of the isolation layer 6053 (step 707).

The selector stack 620 includes a second bottom electrode 621 formed on the top surface of the RRAM stack 6101, and the sidewall of the isolation layer 6051; a first outer layer 623 formed on the second bottom electrode 621, extending long with the sidewall of the isolation layer 6051, and formed on the upper surface of the isolation layer 6053; an inner layer 625 formed on the first outer layer 623; a second outer layer 627 formed on the inner layer 625; and a second top electrode 629 formed on the second outer layer 627.

In some implementations, the second bottom electrode 621 may be formed on the upper surface of the isolation layer 6053. The second top electrode 629 is, in some implementations, a T-shape in a cross-sectional view.

In some implementations, the selector stack 620 may be formed by atomic layer deposition (ALD) to provide thin film conformity and uniformity control.

The second bottom electrode 621, in some implementations, includes conductive TaN (e.g., TaN, with $NH_3$ (75% $H_2$) as reactant). The second top electrode 629, in some implementations, also includes conductive TaN (e.g., TaN, with $NH_3$ (75% $H_2$) as reactant). The resulting TaN film is conductive and can be in crystalline. The resulting TaN film may be used as electrode material.

The first outer layer 623, in some implementations, includes dielectric $TaN_{1+x}$; the inner layer 625, in some implementations, includes dielectric $Ta_2O_5$; and the second outer layer 627, in some implementations, includes dielectric $TaN_{1+x}$. $TaN_{1+x}$, with x>0, is nitrogen-rich (with N2:H2 (2% H2) as reactant). The resulting $TaN_{1+x}$ film is dielectric and is amorphous.

Figure 6F:
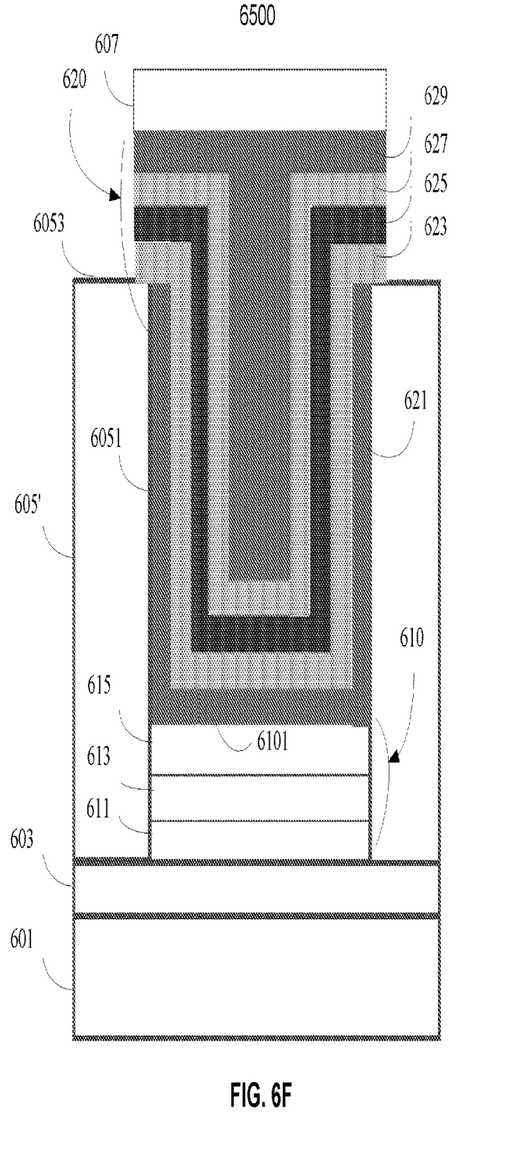

Next, as shown in FIG. 6F, a second line electrode 607 (e.g., a bit-line electrode 607) may be formed on the second top electrode 629 of the selector stack 620 (step 709).

The second line electrode 607, in some implementations, includes Pt, Ti, TiN, Pd, Ir, W, Ta, Hf, Nb, V, TaN, NbN, a combination thereof, or an alloy of one or more conductive materials and Pt, Ti, TiN, Pd, Ir, W, Ta, Hf, Nb, V, TaN, NbN, or a combination thereof.

In some implementations, the bit-line electrode 607 is configured to write to a Resistive Random Access Memory cell (RRAM stack) along a column wire.

The 1R on Top of 1S Architecture

FIGS. 8A-8E are block diagrams illustrating an example 1R on top of 1S architecture in accordance with the present disclosure. FIG. 9 is a flow chart illustrating a method 900 for manufacturing a cross bar array circuit having a 1R on top of 1S architecture in accordance with some implementations of the present disclosure.

Figure 8A:
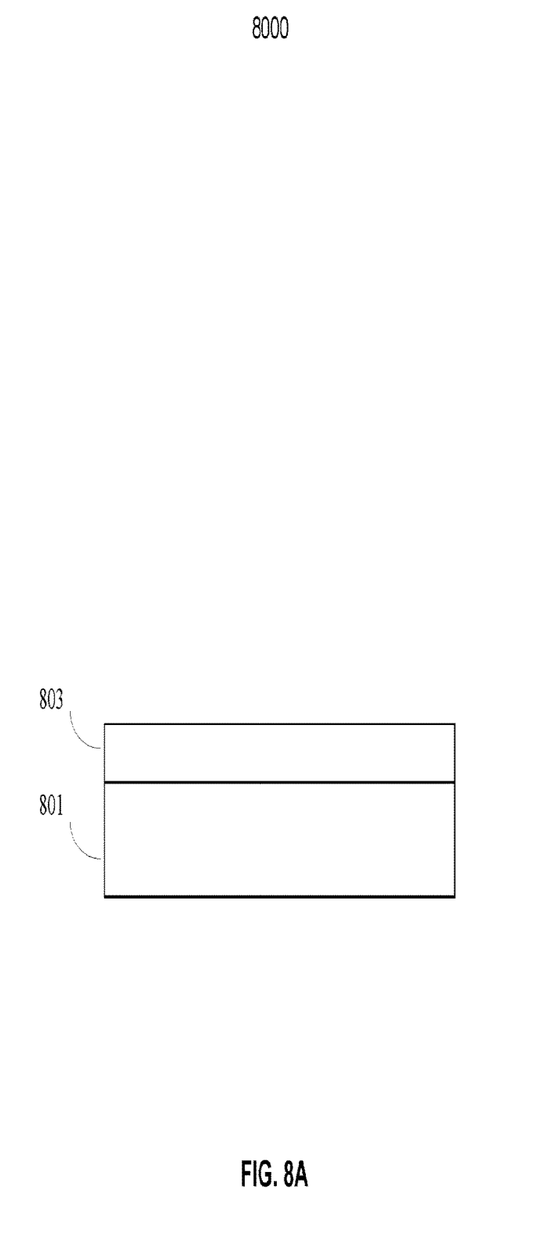
FIGS. 8A-8E are block diagrams illustrating an example 1R on top of 1S architecture in accordance with the present disclosure.
Figure 9:
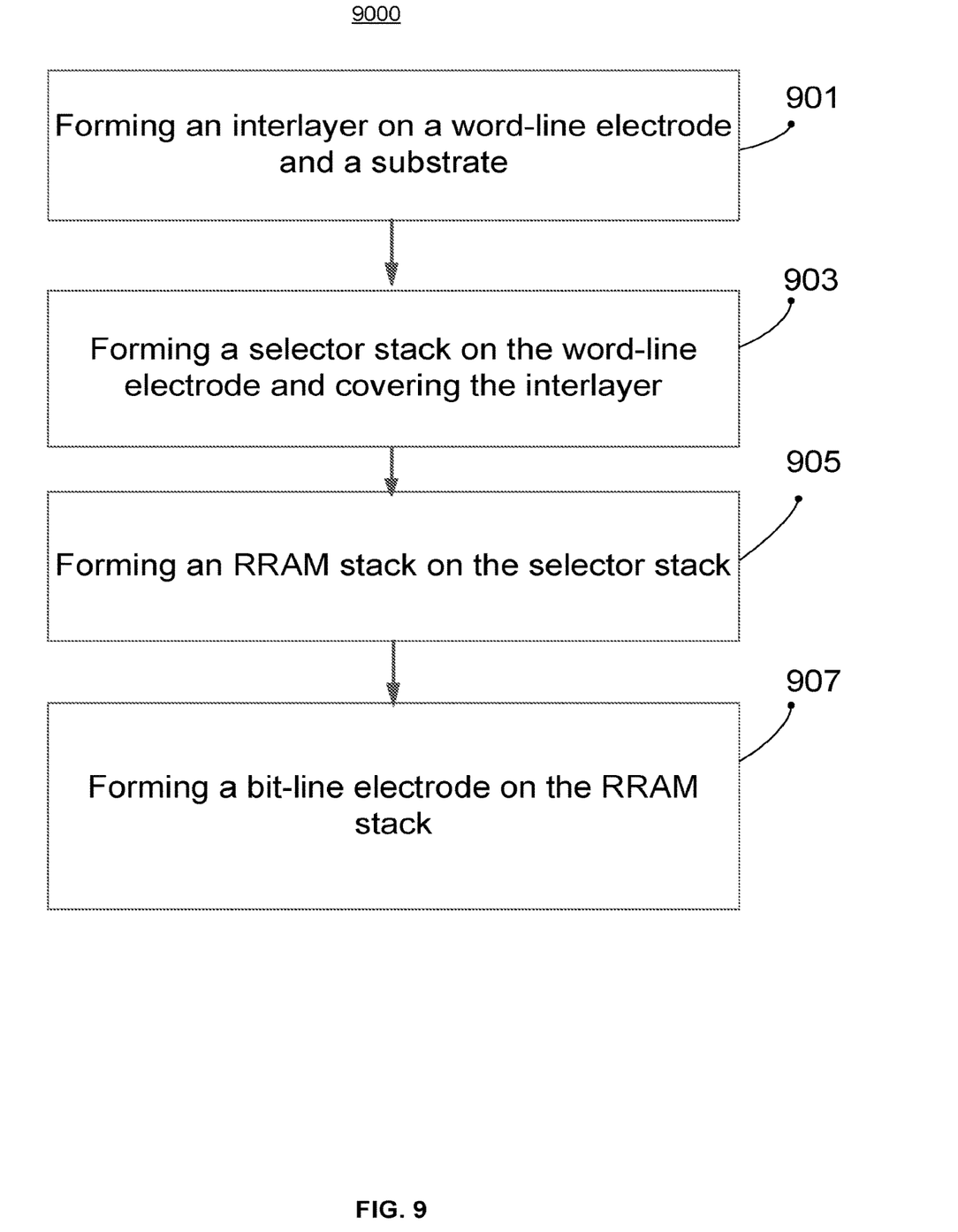
FIG. 9 is a flow chart illustrating a method of manufacturing a cross bar array circuit having a 1R on top of 1S architecture in accordance with some implementations of the present disclosure.

As shown in FIG. 8A, a substrate 801 is provided, and a first line electrode 803 (e.g., a word-line electrode 803) is formed on the substrate 801.

In some implementations, the substrate 801 includes Si, $SiO_2$, SnI. Al2O3, AlN, gallium arsenide, glass, or a combination thereof. In some implementations, the substrate 801 may include one or more doped regions, such as one or more p-doped regions and one or more n-doped regions. In some implementations, the substrate 801 may include transistors, integrated circuits, and interconnects. The substrate 601 may be a workpiece that supports various layers formed on and over, and attached to the substrate 601.

In some implementations, the first line electrode 803 includes Pt, Ti, TiN, Pd, Ir, W, Ta, Hf, Nb, V, TaN, NbN, a combination thereof, or an alloy of one or more conductive materials and Pt, Ti, TiN, Pd, Ir, W, Ta, Hf, Nb, V, TaN, NbN, or a combination thereof.

In some implementations, the word-line electrode 803 is configured to write to a RRAM stack along a row wire.

Figure 8B:
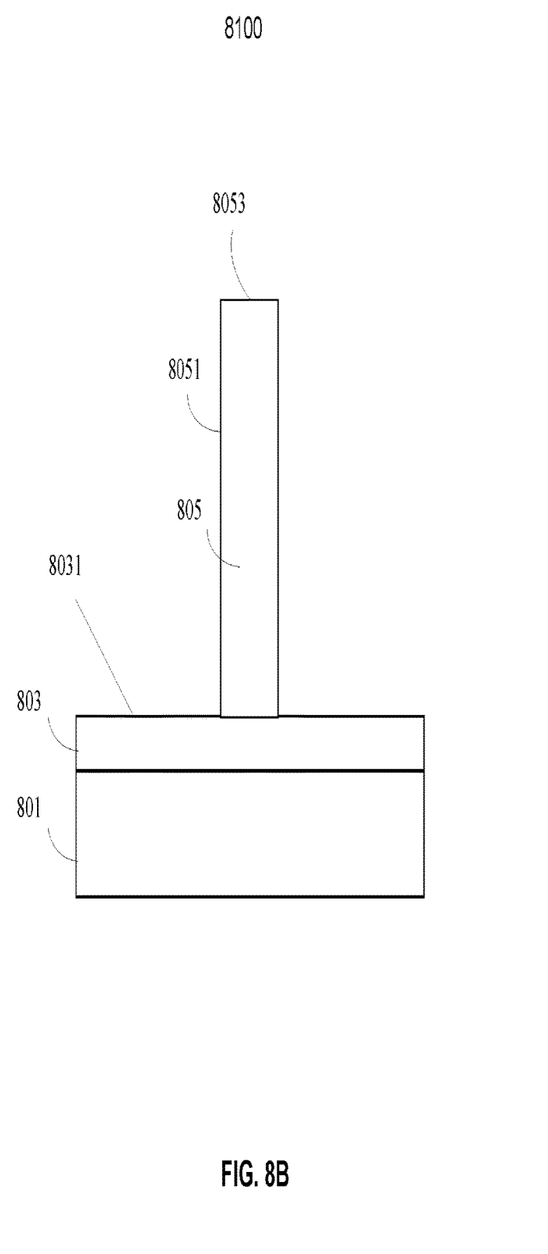

Next, as shown in FIG. 8B, an interlayer 805 is formed on the first line electrode 803 and the substrate 801 (step 901). The interlayer 805 includes a sidewall 8051 and an upper surface 8053.

The interlayer 805 may of be a following shape: a cylinder, a pyramid, a prism, a cone, a pillar, or a protrusion.

In some implementations, the interlayer 805 is formed by forming a layer of interlayer 805 and applying an etching process to expose, for instance, the pillar shape. The etching process may include wet etching or dry etching. The interlayer 805, in some implementations, includes $SiO_2$, SiN, or a combination thereof.

In some implementations, the height (or the thickness) between the upper surface 8053 and the top surface of the first line electrode 8031 may be 100 nanometers to 10 micrometers (e.g., 500 nanometers). The thickness of the interlayer enables a selector to form on top of the interlayer 805 extending along with the sidewall 8051, and to form on the first line electrode 803 to increase the surface area as explained above.

Figures 8C, 8D:
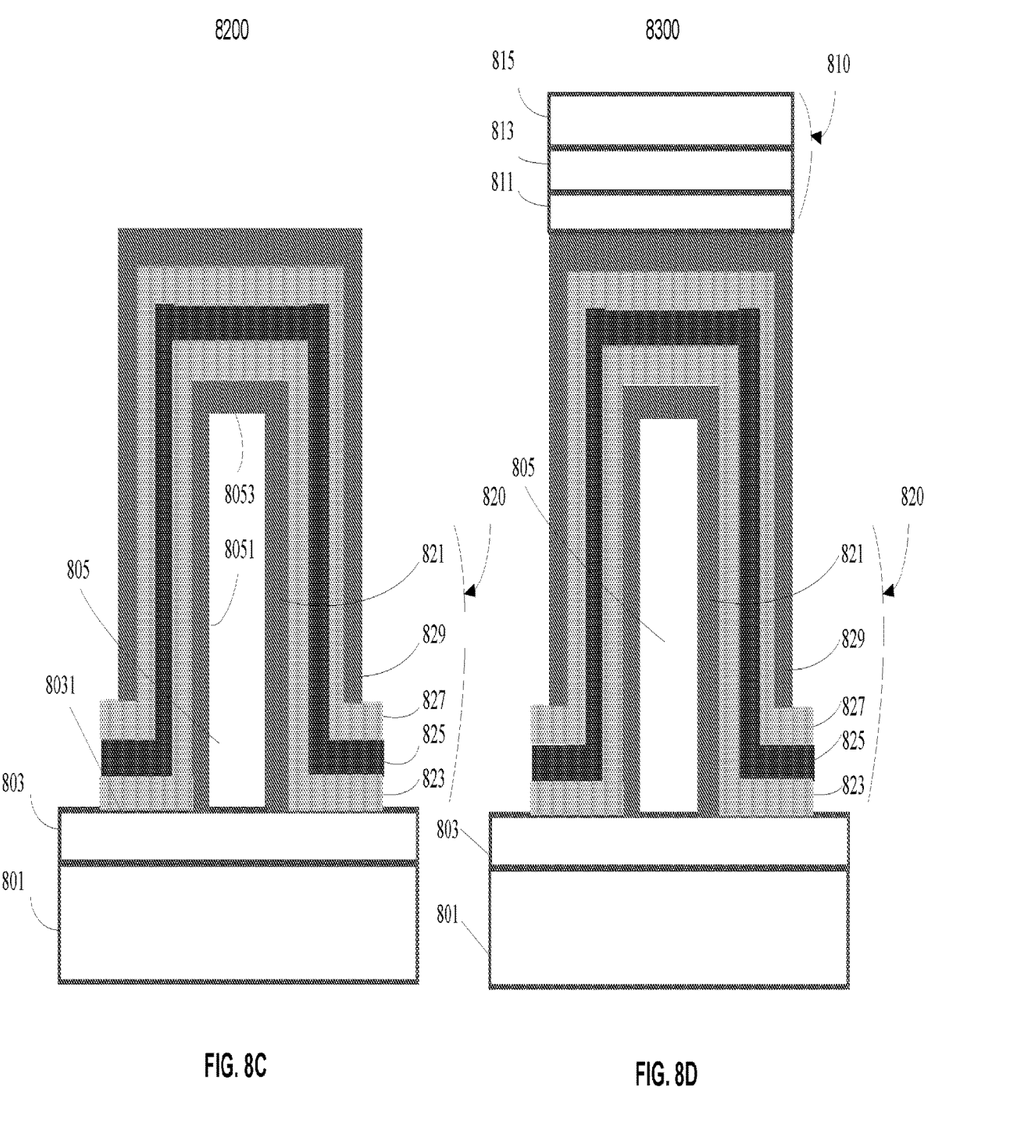

Next, as shown in FIG. 8C, a selector stack 820 is formed on the upper surface 8053 of the interlayer 805 extending along with the sidewall 8051, and to form on the top surface of the first line electrode 8031 (step 903).

The selector stack 820, in some implementations, includes (1) a first bottom electrode 821 formed on the top surface of the interlayer 8053, the sidewall of the interlayer 8051, and the top surface of the first line electrode 8031; (2) a first outer layer 823 formed on the first bottom electrode 821, extending long with the sidewall of the isolation layer 8051, and formed on the top surface of the first line electrode 8031; (3) an inner layer 825 formed on the first outer layer 823; (4) a second outer layer 827 formed on the inner layer 825; and (5) a second top electrode 829 formed on the second outer layer 827.

In some implementations, the selector stack 820 is of a reverse U-shape in a cross-sectional view. The selector stack 820 may be formed by ALD to provide thin film conformity and uniformity control.

The second bottom electrode 821, in some implementations, includes conductive TaN (e.g., TaN, with $NH_3$ (75% $H_2$) reactant). The second top electrode 829, in some implementations, also includes conductive TaN (e.g., TaN, with $NH_3$ (75% $H_2$) reactant). The resulting TaN film is conductive and can be in crystalline; the resulting TaN film may be used as electrode material.

The first outer layer 823, in some implementations, includes dielectric $TaN_{1+x}$; the inner layer 825, in some implementations, includes dielectric $Ta_2O_5$; and the second outer layer 827, in some implementations, includes dielectric $TaN_{1+x}$. $TaN_{1+x}$, with x>0, is nitrogen-rich (with N2:H2 (2% H2) as reactant). The resulting $TaN_{1+x}$ film is dielectric and is amorphous.

Next, as shown in FIG. 8D, an RRAM stack 810 may be formed on the selector stack 820 (step 905).

The RRAM stack 810 includes a second bottom electrode 811, an RRAM oxide layer 813 formed on the second bottom electrode 811, and a second top electrode 815 formed on the RRAM oxide layer 813.

In some implementations the RRAM oxide layer 813 includes $TaO_x$, $HfO_x$, $TiO_x$, $ZrO_x$, or a combination thereof.

The second bottom electrode 811, in some implementations, includes Pt, Pd, Ir Ti, a combination thereof, or an alloy of one or more conductive materials and Pt, Pd, Ir, Ti, or a combination thereof. The second top electrode 815, in some implementations, includes Pt, Ti, TiN, Pd, Ir, W, Ta, Hf, Nb, V, TaN, NbN, a combination thereof, or an alloy of one or more conductive materials and Pt, Ti, TiN, Pd, Ir, W, Ta, Hf, Nb, V, TaN, NbN, or a combination thereof.

Figure 8E:
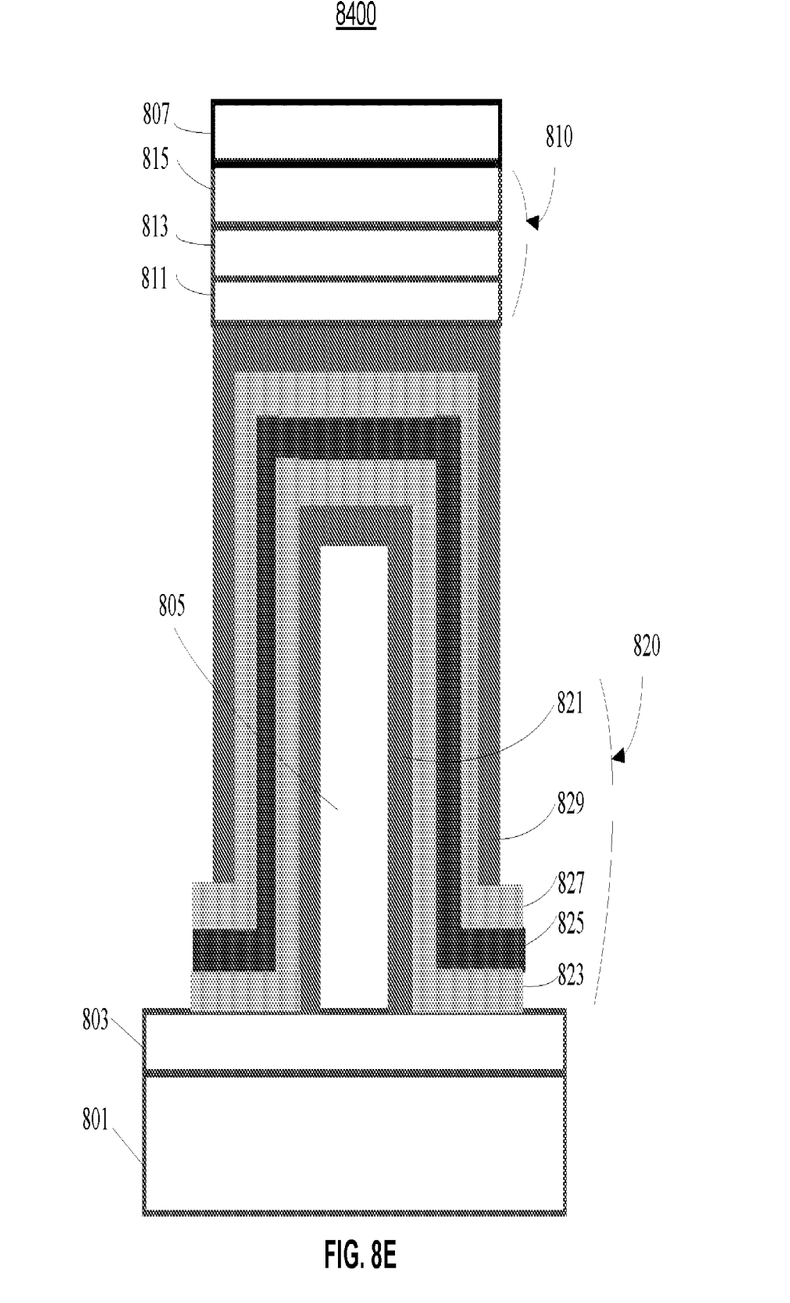

Next, as shown in FIG. 8E a second line electrode 807 (e.g., a bit-line electrode 807) is formed on the RRAM stack 810. (step 907)

The second line electrode 807, in some implementations, includes Pt, Ti, TiN, Pd, Ir, W, Ta, Hf, Nb, V, TaN, NbN, a combination thereof, or an alloy of one or more conductive materials and Pt, Ti, TiN, Pd, Ir, W, Ta, Hf, Nb, V, TaN, NbN, or a combination thereof.

In some implementations, the bit-line electrode 807 is configured to write to a RRAM stack along a column wire.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation(s).

It will also be understood that, although the terms "first," "second," etc. may be used herein to describe various elements, these elements should not be limited by these terms. These terms are only used to distinguish one element from another. For example, a first column could be termed a second column, and, similarly, a second column could be termed the first column, without changing the meaning of the description, so long as all occurrences of the "first column" are renamed consistently and all occurrences of the "second column" are renamed consistently. The first column and the second are columns both column s, but they are not the same column.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures, and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:

1. An apparatus, comprising:
   a substrate;
   a first line electrode formed on the substrate;
   an interlayer of a dielectric material, wherein the interlayer is formed on the first line electrode, wherein the interlayer comprises an upper surface and a sidewall, and wherein a shape of the interlayer comprises a cylinder, a pyramid, a prism, a cone, a pillar, or a protrusion;
   a selector stack formed on the interlayer and the first line electrode, wherein the selector stack is formed on the upper surface of the interlayer extending along the sidewall of the interlayer and is formed on a top surface of the first line electrode;
   an RRAM stack formed on the selector stack; and
   a second line electrode formed on the RRAM stack.

2. The apparatus as claimed in claim 1, wherein a height from the upper surface to the first line electrode is 100 nanometers to 10 micrometers.

3. The apparatus as claimed in claim 1, wherein the selector stack is of a reverse U-shape in a cross-sectional view.

4. The apparatus as claimed in claim 1, wherein the selector stack comprises a first bottom electrode, a first outer layer formed on the first bottom electrode, an inner layer formed on the first outer layer, a second outer layer formed on the inner layer, and a first top electrode formed on the second outer layer, and wherein the RRAM stack comprises a second bottom electrode, an RRAM oxide layer, and a second top electrode.

5. The apparatus as claimed in claim 4, wherein the first outer layer comprises $TaN_{1+x}$, wherein the inner layer comprises $Ta_2O_5$, and wherein the RRAM oxide layer comprises at least one of $TaO_x$, $HfO_x$, $TiO_x$, or $ZrO_x$.

6. The apparatus as claimed in claim 4, wherein the first bottom electrode is formed on the upper surface of the interlayer, the sidewall of the interlayer, and the top surface of the first line electrode.

7. The apparatus as claimed in claim 6, wherein the first outer layer is formed on the top surface of the first line electrode.

8. The apparatus as claimed in claim 4, wherein the second outer layer comprises $TaN_{1+x}$.

9. The apparatus as claimed in claim 4, wherein the RRAM oxide layer comprises at least one of $TaO_x$, $HfO_x$, $TiO_x$, $ZrO_x$.

10. The apparatus as claimed in claim 4, wherein the second bottom electrode comprises at least one of Pt, Pd, Ir, or Ti.

11. The apparatus as claimed in claim 10, wherein the second top electrode comprises at least one of Pt, TI, TIN, Pd, Ir, W, Ta, Hf, Nb, V, TaN, NbN.

* * * * *